United States Patent
Yang et al.

(10) Patent No.: US 9,899,979 B2
(45) Date of Patent: Feb. 20, 2018

(54) METHOD FOR RECORDING A PLAYBACK SETTING OF SOUND AND ELECTRONIC DEVICE PERFORMING THE SAME

(71) Applicant: Unlimiter MFA Co., Ltd., Eden Island (SC)

(72) Inventors: Kuo-Ping Yang, Taipei (TW); Neo Bob Chih-Yung Young, Taipei (TW); Kuan-Li Chao, Taipei (TW); Ming-Ren Ma, Taipei (TW); Chih-Long Chang, Taipei (TW)

(73) Assignee: UNLIMITER MFA CO., LTD., Eden Island (SC)

( * ) Notice: Subject to any disclaimer, the term of this patent is extended or adjusted under 35 U.S.C. 154(b) by 0 days.

(21) Appl. No.: 15/249,638

(22) Filed: Aug. 29, 2016

(65) Prior Publication Data

US 2017/0310293 A1    Oct. 26, 2017

(30) Foreign Application Priority Data

Apr. 25, 2016   (TW) .............................. 105112839 A

(51) Int. Cl.
*H03G 5/16*        (2006.01)
*G06F 3/16*        (2006.01)
*H04R 3/04*        (2006.01)

(52) U.S. Cl.
CPC ............ *H03G 5/165* (2013.01); *G06F 3/165* (2013.01); *H04R 3/04* (2013.01)

(58) Field of Classification Search
CPC ........ H03G 5/165; H03G 5/025; G06F 3/165; H04R 3/04

USPC .......................................... 381/98, 102, 103
See application file for complete search history.

(56) References Cited

U.S. PATENT DOCUMENTS

| | | | | |
|---|---|---|---|---|
| 6,959,220 B1* | 10/2005 | Wiser | .............. | G11B 20/10527 381/103 |
| 8,527,876 B2* | 9/2013 | Wood | .................. | G06F 3/048 375/354 |
| 9,706,302 B2* | 7/2017 | Hansen | ................. | H04R 3/04 |
| 2003/0035555 A1* | 2/2003 | King | ...................... | H03G 5/005 381/103 |
| 2003/0103079 A1* | 6/2003 | Adatia | ................. | G06F 3/0481 715/762 |
| 2007/0078551 A1* | 4/2007 | Lai | ......................... | G11B 20/10 700/94 |
| 2009/0047993 A1* | 2/2009 | Vasa | .................... | G11B 27/105 455/556.1 |
| 2009/0174823 A1* | 7/2009 | Knutson | ................ | H04S 7/307 348/738 |
| 2015/0382096 A1* | 12/2015 | Lamar | ................. | H04R 1/1041 381/74 |

* cited by examiner

*Primary Examiner* — David Ton
(74) *Attorney, Agent, or Firm* — Bacon & Thomas, PLLC

(57) ABSTRACT

A method for recording a playback setting of sound is disclosed. The method is applied to an electronic device having an equalizer and includes the following steps of: acquiring an archival data of a sound file played by the electronic device; receiving a set record command; acquiring a gain setting data of the equalizer according to the set record command; pairing the archival data with the gain setting data to generate a pairing data; and saving the pairing data.

2 Claims, 6 Drawing Sheets

METHOD FOR RECORDING A PLAYBACK SETTING OF SOUND AND ELECTRONIC DEVICE PERFORMING THE SAME

BACKGROUND OF THE INVENTION

1. Field of the Invention

The present invention relates to a method for recording a playback setting of sound, and more particularly, to a method which can automatically record a playback setting of sound.

2. Description of the Related Art

Music comes in many different types and styles, so when listening to music, some users will try to change the sound effect by adjusting the settings of the equalizer. For example, many people would like to boost the loudness of the bass part of the song to enhance the shocking effect of the music when listening to heavy metal music.

However, whenever the user wants to play the same song, it is necessary to adjust the equalizer settings again to achieve the same sound effect, which is troublesome for the user, in addition, it is also possible that the user will forget the previous settings and be unable to change the settings quickly.

SUMMARY OF THE INVENTION

It is an object of the present invention to provide a method for recording a playback setting of sound.

It is an object of the present invention to provide an electronic device for carrying out the above method.

In order to achieve the above objects, the present invention discloses a method for recording a playback setting of sound. The method can be applied to an electronic device having an equalizer and comprises the following steps of: acquiring an archival data of a sound file played by the electronic device; receiving a set record command; acquiring a gain setting data of the equalizer according to the set record command, wherein the gain setting data comprises a plurality of adjustment values each corresponding to a different frequency value; pairing the archival data with the gain setting data to generate a pairing data; and saving the pairing data such that whenever the electronic device plays the sound file again, the equalizer can set each gain adjustment value of the sound file of each frequency value to be the adjustment value corresponding to the frequency value according to the pairing data.

The present invention also discloses an electronic device comprising: an equalizer; a memory; and a processor electrically coupled with the equalizer and the memory. The processor acquires an archival data of a sound file played by the electronic device and receives a set record command; after receiving the set record command, the processor acquires a gain setting data of the equalizer according to the set record command and pairs the archival data with the gain setting data to generate a pairing data, wherein the gain setting data comprises a plurality of adjustment values each corresponding to a different frequency value; after generating the pairing data, the processor saves the pairing data in the memory.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

The advantages and innovative features of the invention will become more apparent from the following detailed description when taken in conjunction with the accompanying drawings.

Figure 1:
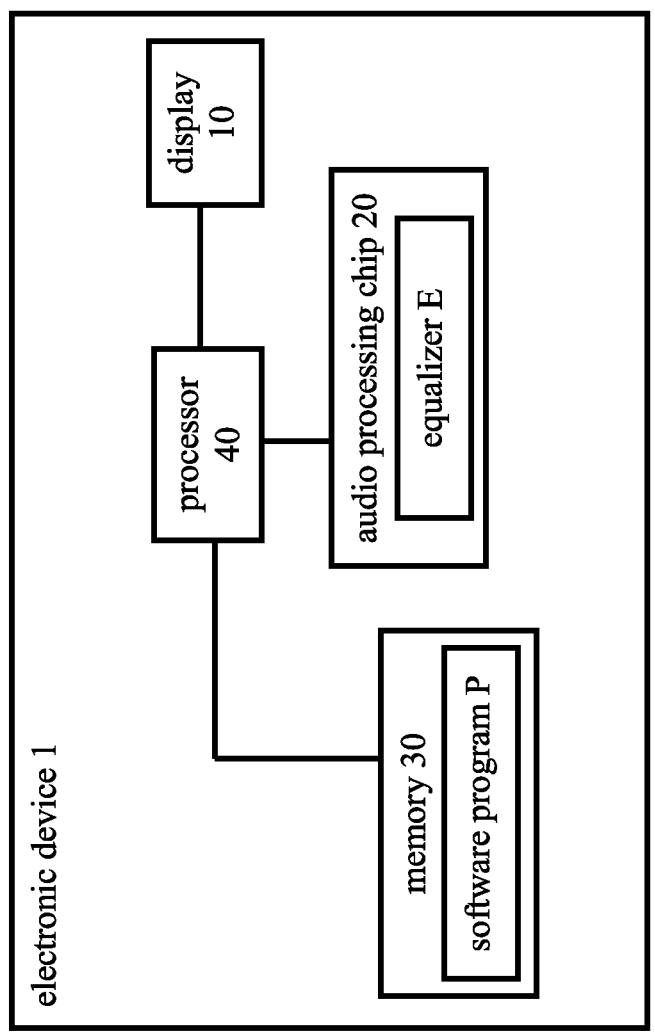
FIG. 1 illustrates a structural view of an electronic device of the present invention.
Figure 2:
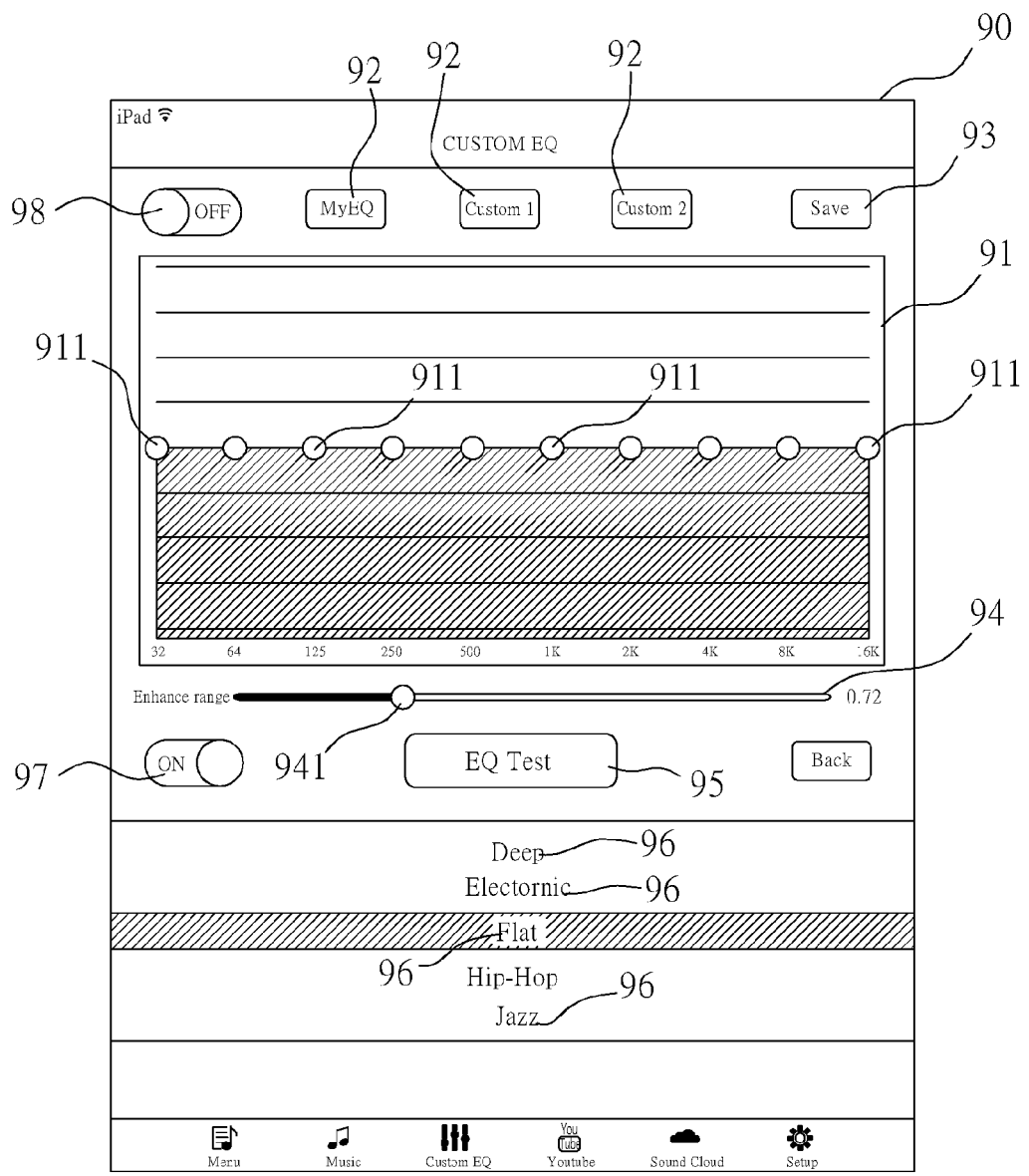
FIG. 2 illustrates a view of an equalizer with an original mode activated.
Figure 3:
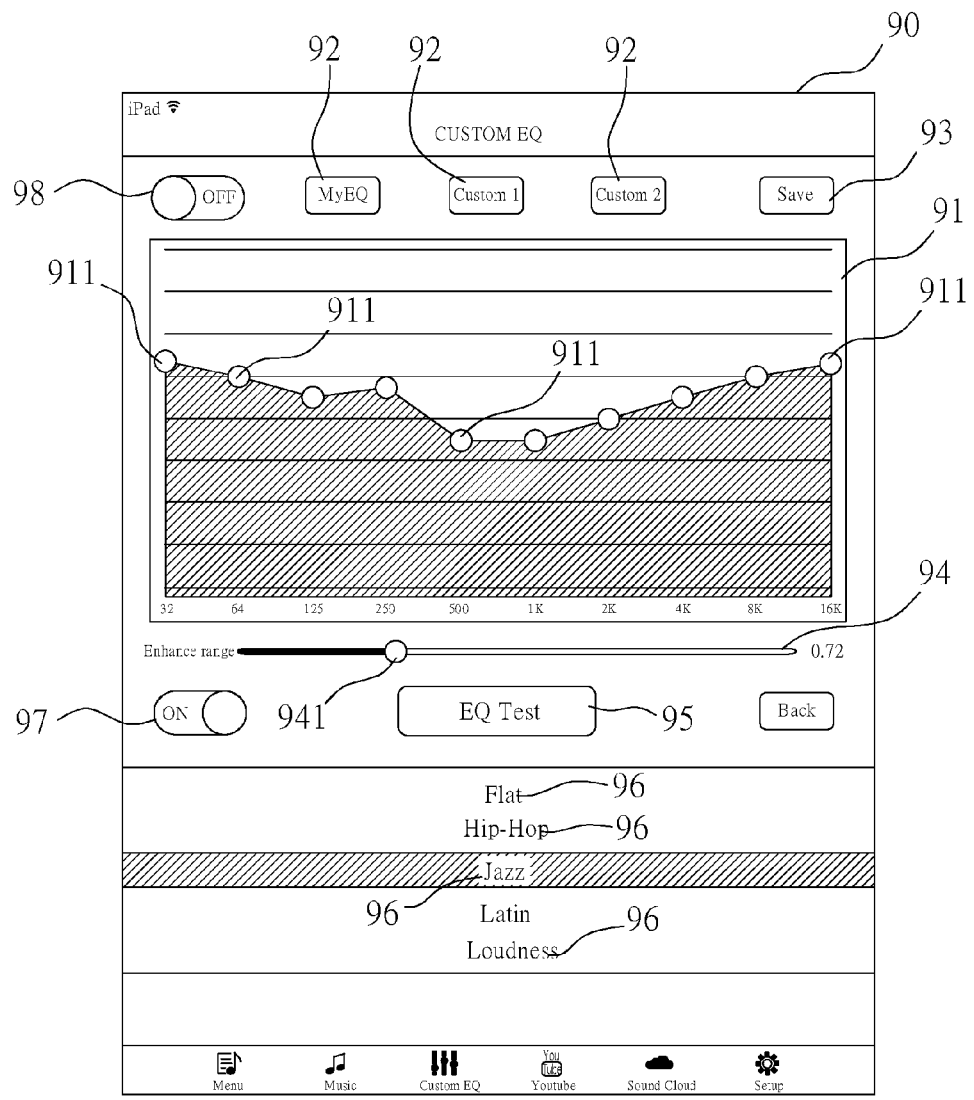
FIG. 3 illustrates a view of the equalizer with only a built-in mode activated.
Figure 4:
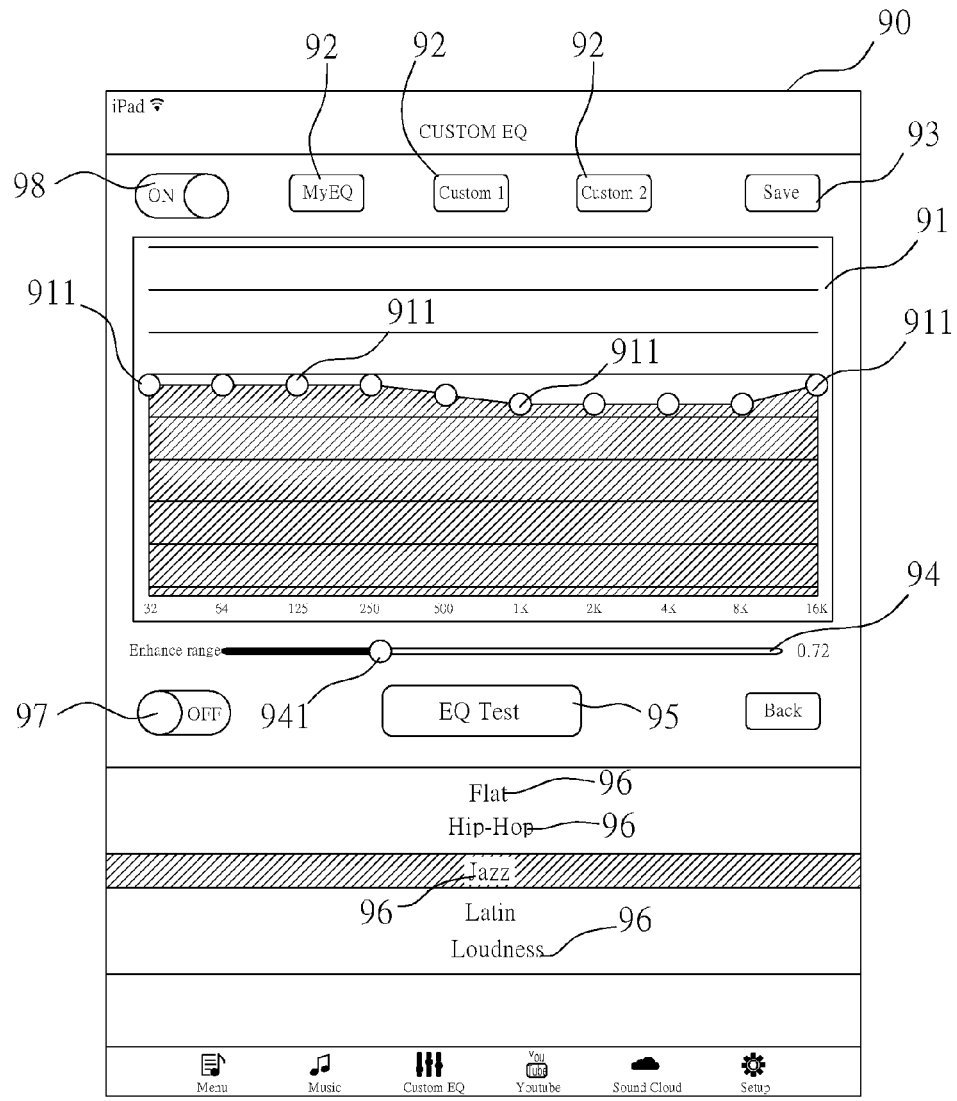
FIG. 4 illustrates a view of the equalizer with only a custom mode activated.
Figure 5:
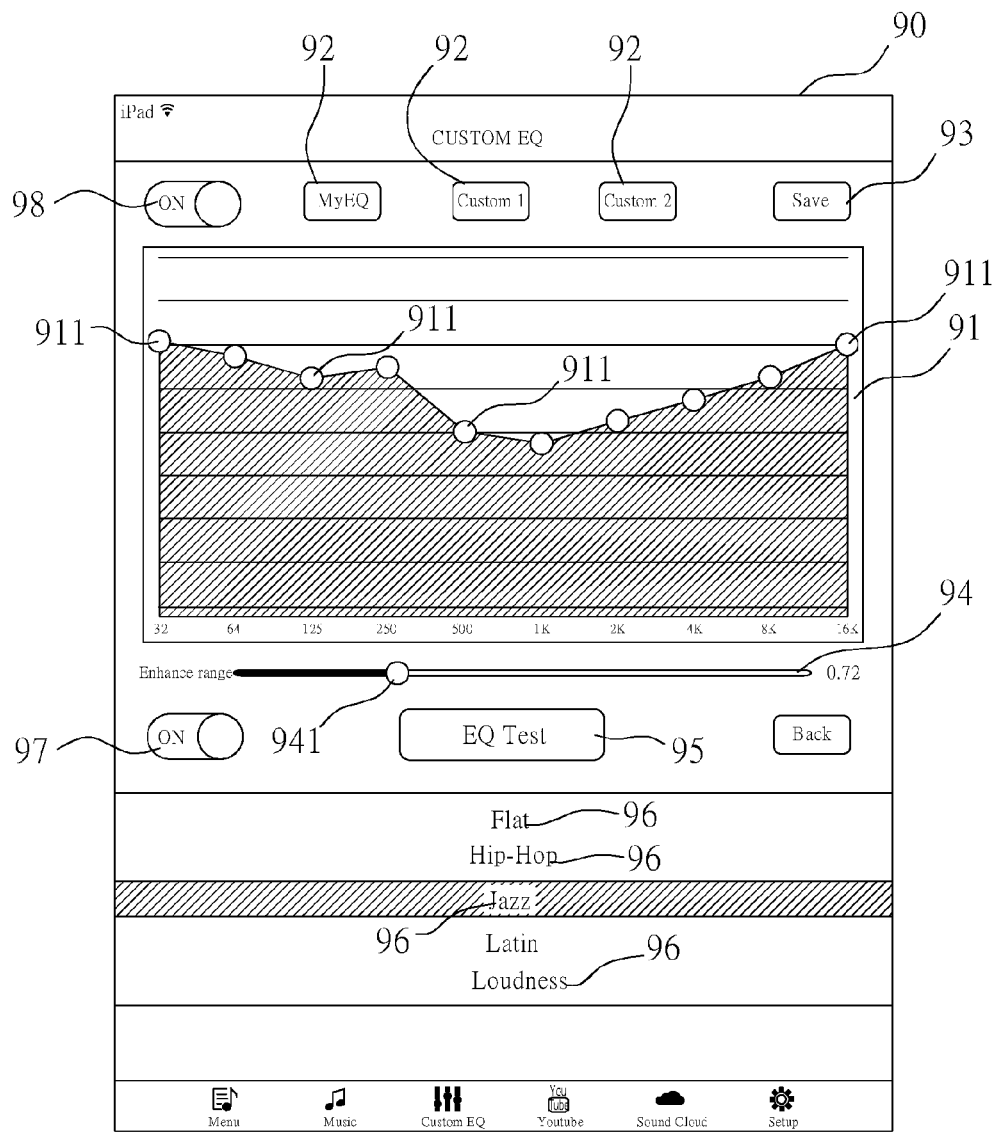
FIG. 5 illustrates a view of the equalizer with both the built-in mode and the custom mode activated simultaneously.

Please refer to FIG. 1 to FIG. 5, in which FIG. 1 illustrates a structural view of an electronic device of the present invention; FIG. 2 illustrates a view of an equalizer with an original mode activated; FIG. 3 illustrates a view of the equalizer with only a built-in mode activated; FIG. 4 illustrates a view of the equalizer with only a custom mode activated; and FIG. 5 illustrates a view of the equalizer with both the built-in mode and the custom mode activated simultaneously.

As shown in FIG. 1, in an embodiment of the present invention, an electronic device 1 of the present invention comprises a display 10, an audio processing chip 20, a memory 30 and a processor 40. In a specific embodiment of the present invention, the electronic device 1 is a smart phone, but it is not limited to this embodiment.

The display 10, such as a touch display, can display image content containing a user interface 90 as shown in FIG. 2 to FIG. 5. Details of the user interface 90 will be described below.

The audio processing chip 20 converts the input/output audio signals into digital/analog signals. In an embodiment of the present invention, the audio processing chip 20 comprises an equalizer E. The audio processing chip 20 processes audio signals according to the settings of the gain adjustment values of the equalizer E. It is noted that the equalizer E of the electronic device 1 is not necessarily implemented in the audio processing chip 20; in other embodiments, the equalizer E can be implemented as a software program and stored in the memory 30, which is accessed and run by the processor 40.

The memory 30 stores a software program P. The processor 40 is electrically coupled with the display 10, the equalizer E of the audio processing chip 20, and the memory 30; when the processor 40 loads and runs the software program P, the processor implements the method for recording a playback setting of sound mentioned below. Details of various functions implemented by the processor 40 loading the software program P will be described below.

Figure 6:
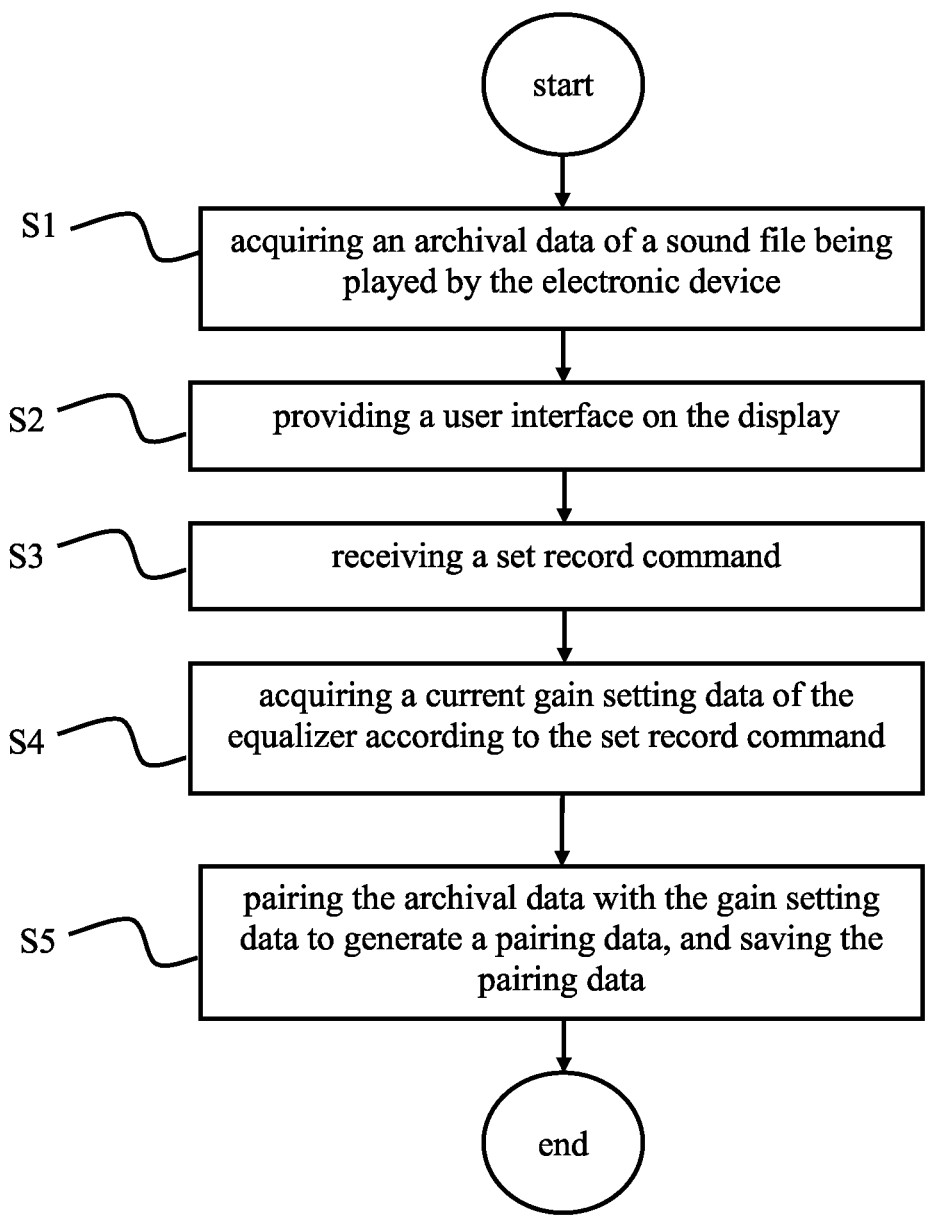
FIG. 6 illustrates a flowchart of the method for recording a playback setting of sound of the present invention.

Next, please refer to FIG. 1 to FIG. 6. FIG. 6 illustrates a flowchart of the method for recording a playback setting of sound of the present invention. FIG. 1 to FIG. 5 will be used to explain every step of FIG. 6. It is noted that although this embodiment uses the electronic device 1 to describe the method for recording a playback setting of sound, the method for recording a playback setting of sound can be applied to various devices other than the electronic device 1.

First step S1 is performed: acquiring an archival data of a sound file being played by the electronic device.

First, when a user uses the electronic device 1 to play a sound file (for example, music) stored in the memory 30, a network drive, or a remote server, the processor 40 can acquire the archival data of the sound file played by the electronic device 1.

Then step S2 is performed: providing a user interface on the display.

When the electronic device 1 is playing a specific sound file, the user can adjust the output sound effect by using the user interface 90 as shown in FIG. 2 to FIG. 5. In a specific embodiment of the present invention, a virtual icon shown on the display 10 is provided for the user to click to input an equalizer start command. After the user clicks the virtual icon, the processor 40 provides the user interface 90 on the display according to the equalizer start command. Alternatively, the processor 40 can automatically provide the user interface 90 on the display 10 whenever a new sound file is played.

As shown in FIG. 2, in an embodiment of the present invention, the user interface 90 comprises an equalizer setting display area 91, a plurality of custom mode options 92, a save button 93, an adjusting bar 94, a test start button 95, a plurality of built-in mode options 96, and two mode start options 97 and 98.

As shown in FIG. 2, in an embodiment of the present invention, the equalizer setting display area 91 displays a current gain setting data of the equalizer E, wherein the gain setting data comprises a plurality of adjustment values, each adjustment value corresponding to a different frequency value (for example, in FIG. 2, the frequency values are 32, 64, 125, 250, 500, 1,000, 2,000, 4,000, 8,000 and 16,000 Hz). The equalizer setting display area 91 comprises a plurality of indication buttons 911, wherein each indication button 911 indicates a gain adjustment value of the equalizer E for sound of a specified frequency. As shown in FIG. 2, each gain adjustment value of the equalizer E is 0 dB.

In an embodiment of the present invention, the custom mode options 92 are provided for the user to quickly input a specific gain setting data, wherein the specific gain setting data is set by the user in advance or is set according to a listening test result of the user in advance.

In a specific embodiment of the present invention, the custom mode options are set as follows: first, the user clicks one of the custom mode options 92; when the custom mode option 92 is clicked, the electronic device 1 enters a setting mode. In the setting mode, the user can adjust the height or the position of the plurality of indication buttons 911; in other words, the user can adjust each gain adjustment value. After the adjustment is done, the user clicks the save button 93 so that the processor 40 will set the gain adjustment value to be the adjustment value of the gain setting data and so that the custom mode options 92 selected by the user will be paired with the gain setting data. After the setting process is done, whenever the user clicks the custom mode option 92, the user can quickly retrieve the paired gain setting data.

In an specific embodiment of the present invention, the steps of setting the gain setting data according to a listening test result of the user are as follows: first, the user clicks one of the custom mode options 92 to enter the setting mode; when in the setting mode, the user clicks the test start button 95, which enables the processor 40 running the software program P to provide a test procedure to the user. After the user follows the instructions on the display 10 to finish the test procedure, the processor 40 can acquire the preferences of the user for sounds having different frequency values and adjust the gain adjustment value of the equalizer E according to the listening test result. Please refer to Taiwan Patent M519370 for details of how to use the listening test result to adjust the gain adjustment value of the equalizer E.

The adjusting bar 94 is provided for the user to change the position of the adjusting button 941 to simultaneously increase or decrease the gain adjustment values by the same multiplier. For example, as shown in FIG. 3, the original gain adjustment values are 1.2, 1, 0.5, 0.8, −0.5, −0.5, 0, 0.6, 1 and 1.2 dB respectively; when the user moves the adjusting button 941 to the very right side, the gain adjustment values are doubled to become 2.4, 2, 1, 1.6, −1, −1, 0, 1.2, 2 and 2.4 dB respectively.

The function of the built-in mode options 96 is same as that of the custom mode options 92; both allow the user to click to quickly input a specific gain setting data. However, the specific gain setting data inputted by clicking the built-in mode options 96 is predetermined by the software program P.

The two mode start options 97 and 98 are provided for the user to activate the built-in mode and/or the custom mode of the equalizer E. As shown in FIG. 3, in an embodiment of the present invention, when the mode start option 97 is turned "ON" and the mode start option 98 is turned "OFF", the processor 40 activates only the built-in mode of the equalizer E. Concurrently, the equalizer E sets the gain setting data according to the built-in mode (such as the Jazz mode) selected by the user, wherein the adjustment values of the gain setting data are first values (for example, as shown in FIG. 3, the first values are 1.2, 1, 0.5, 0.8, −0.5, −0.5, 0, 0.6, 1 and 1.2 dB).

On the other hand, in FIG. 4, when the mode start option 97 is turned "OFF" and the mode start option 98 is turned "ON", the processor 40 activates only the custom mode of the equalizer E. Concurrently, the equalizer E sets the gain setting data according to the custom mode selected by the user, wherein the adjustment values of the gain setting data are second values (for example, as shown in FIG. 4, the second values are 0.8, 0.8, 0.8, 0.8, 0.5, 0.2, 0.2, 0.2, 0.2 and 0.8 dB).

As shown in FIG. 5, when the mode start option 97 is turned "ON" and the mode start option 98 is also turned "ON", the processor 40 activates both the built-in mode and the custom mode of the equalizer E. Concurrently, the equalizer E sets the gain setting data according to the built-in mode and the custom mode selected by the user, wherein the adjustment values of the gain setting data are third values, and each third value is the sum of each first value and each second value respectively (for example, as shown in FIG. 5, the third values are 2, 1.8, 1.3, 1.6, 0, −0.3, 0.2, 0.8, 1.2 and 2 dB).

Then step S3 is performed: receiving a set record command.

When the user uses the user interface 90 to adjust the gain adjustment value of the equalizer E, the sound effect outputted by the electronic device 1 playing the sound file will be changed. If the user is satisfied with the newly-adjusted sound effect for the sound file, the user can click the save button 93 to input a set record command, which is received by the processor 40 of the electronic device 1.

Then step S4 is performed: acquiring a current gain setting data of the equalizer according to the set record command.

After step S3 is completed, the processor 40 acquires a current gain setting data of the equalizer E according to the set record command. For example, in FIG. 3, the gain setting data comprises a plurality of adjustment values of 1.2, 1, 0.5, 0.8, −0.5, −0.5, 0, 0.6, 1 and 1.2 dB. If the user clicks the save button 93 in the user interface 90 shown in FIG. 5, then the gain setting data acquired according to the set record command includes a plurality of adjustment values of 2, 1.8, 1.3, 1.6, 0, −0.3, 0.2, 0.8, 1.2 and 2 dB.

Finally, step S5 is performed: pairing the archival data with the gain setting data to generate a pairing data, and saving the pairing data.

After step S4 is completed, the processor 40 pairs the acquired gain setting data with the archival data to generate a pairing data and stores the pairing data in the memory 30.

Therefore, whenever the electronic device 1 plays the same sound file again, the electronic device 1 can look up the pairing data to acquire the gain setting data paired with the archival data of the sound file. Then the electronic device 1 automatically sets each gain adjustment value of the equalizer E for sound having a specific frequency value to be each adjustment value of the gain setting data (for example, in FIG. 3, the adjustment values are 1.2, 1, 0.5, 0.8, −0.5, −0.5, 0, 0.6, 1 and 1.2 dB) according to the pairing data.

It is noted that the method for recording a playback setting of sound is not limited to the order of steps disclosed above. The method can be carried out in any other order as long as it achieves the object of the present invention.

As above, the present invention discloses a method for a user to record a sound file and a gain setting data, which enables the electronic device 1 to play the same sound file next time; the electronic device 1 can automatically set the gain adjustment value of the equalizer E to be the values provided by the gain setting data.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A method for recording a playback setting of sound, the method being applied to an electronic device having an equalizer and comprising the following steps of:
   acquiring an archival data of a sound file being played by the electronic device;
   receiving a set record command;
   acquiring a current gain setting data of the equalizer according to the set record command, wherein the gain setting data comprises a plurality of adjustment values each corresponding to a different frequency value; and
   pairing the archival data with the gain setting data to generate a pairing data, and saving the pairing data, and
   providing a user interface on the display, wherein the user interface comprises a record button for generating the set record command after being clicked;
   wherein the equalizer comprises at least one built-in mode and one custom mode; the user interface further comprises at least one mode start option, wherein the mode start option is provided for activating one of the at least one built-in mode and the custom mode of the equalizer, or to activate both the at least one built-in mode and the custom mode simultaneously; and
   wherein when the at least one built-in mode of the equalizer is activated, the adjustment values of the gain setting data of the equalizer are a plurality of first values; when the custom mode of the equalizer is activated, the adjustment values of the gain setting data of the equalizer are a plurality of second values; when the at least one built-in mode and the custom mode of the equalizer are activated simultaneously, the adjustment values of the gain setting data of the equalizer are a plurality of third values, wherein each of the third values is equal to a sum of each of the first values and each of the second values respectively;
   whereby, whenever the electronic device plays the sound file again, the electronic device automatically sets each gain adjustment value of the equalizer for each of the different frequency values to be each of the adjustment values according to the pairing data.

2. An electronic device comprising:
   an equalizer;
   a memory; and
   a processor electrically coupled with the equalizer and the memory, the processor being used for acquiring an archival data of a sound file being played by the electronic device, and receiving a set record command; the processor is further used for acquiring a current gain setting data of the equalizer according to the set record command after receiving the set record command and pairing the archival data with the gain setting data to generate a pairing data, wherein the gain setting data comprises a plurality of adjustment values each corresponding to a different frequency value; the processor is further used for saving the pairing data in the memory after generating the pairing data, and
   a display, wherein the processor further is used for providing a user interface on the display, and the user interface comprises a record button for generating the set record command after being clicked;
   wherein the equalizer comprises at least one built-in mode and one custom mode; the user interface further comprises at least one mode start option, wherein the at least one mode start option is provided for activating one of the at least one built-in mode and the custom mode of the equalizer, or for activating the at least one built-in mode and the custom mode of the equalizer simultaneously; and
   wherein when the at least one built-in mode of the equalizer is activated, the adjustment values of the gain setting data of the equalizer are a plurality of first values; when the custom mode of the equalizer is activated, the adjustment values of the gain setting data of the equalizer are a plurality of second values; when the at least one built-in mode and the custom mode of the equalizer are activated simultaneously, the adjustment values of the gain setting data of the equalizer are a plurality of third values, wherein each of the third values is equal to a sum of each of the first values and each of the second values respectively.

* * * * *